United States Patent
Buffat et al.

(10) Patent No.: US 6,576,405 B1
(45) Date of Patent: Jun. 10, 2003

(54) HIGH ASPECT RATIO PHOTOLITHOGRAPHIC METHOD FOR HIGH ENERGY IMPLANTATION

(75) Inventors: Stephen J. Buffat, Meridian, ID (US); Jean L. Adams, Nampa, ID (US)

(73) Assignee: ZiLOG, Inc., San Jose, CA (US)

( * ) Notice: Subject to any disclaimer, the term of this patent is extended or adjusted under 35 U.S.C. 154(b) by 0 days.

(21) Appl. No.: 09/346,246

(22) Filed: Jul. 1, 1999

(51) Int. Cl.$^7$ .............................. G03F 7/00; G03F 7/38; G03F 7/40
(52) U.S. Cl. ....................... 430/322; 430/311; 430/325; 430/328; 430/330; 430/394; 430/432; 430/942
(58) Field of Search .................................. 430/311, 322, 430/325, 328, 330, 394, 432, 942

(56) References Cited

U.S. PATENT DOCUMENTS

| | | | | |
|---|---|---|---|---|
| 4,548,688 A | * | 10/1985 | Matthews | 204/159.18 |
| 4,904,866 A | * | 2/1990 | Collins | 250/492.2 |
| 5,091,332 A | | 2/1992 | Bohr et al. | 437/69 |
| 5,108,870 A | * | 4/1992 | Shalom | 430/190 |
| 5,262,281 A | | 11/1993 | Bauer et al. | 430/323 |
| 5,322,764 A | * | 6/1994 | Kamiyama et al. | 430/324 |
| 5,330,881 A | | 7/1994 | Sidman et al. | 430/322 |
| 5,340,702 A | | 8/1994 | Hirasawa et al. | 430/326 |
| 5,356,828 A | | 10/1994 | Swan et al. | 437/67 |
| 5,591,654 A | * | 1/1997 | Kishimura | 437/26 |
| 5,722,162 A | | 3/1998 | Chou et al. | 29/852 |
| 5,789,140 A | | 8/1998 | Chou et al. | 430/296 |
| 5,821,589 A | | 10/1998 | Borland | 257/369 |
| 5,858,620 A | * | 1/1999 | Ishibashi et al. | 430/313 |
| 5,886,119 A | * | 3/1999 | Schaedeli et al. | 526/266 |
| 6,117,622 A | * | 9/2000 | Eisele | 430/328 |

OTHER PUBLICATIONS

NN 79102134, "Resist Stabilization by Electron Beam", Oct. 1979, IBM Technical Disclosure Bulletin, vol. No. 22, issue No. 5, p. No. 2134.*
Matthews, "Stabilization of single layer and multilayer resist patterns to aluminum etching environments", Mar. 1984, SPIE Conference, Optical Microlithography III.*
Cullmann et al., "Advanced Resist Processing for Thick Photoresist Applications", Microelectronic Engineering vol. 30, pp. 551–554, 1996.

(List continued on next page.)

Primary Examiner—Mark F. Huff
Assistant Examiner—Nicole Barreca
(74) Attorney, Agent, or Firm—Parsons Hsue & de Runtz LLP

(57) ABSTRACT

A photolithographic method for manufacturing a CMOS semiconductor device having retrograde twin well with high aspect ratio (of thickness of the photoresist to width of the mask line or thickness of the resulting structure to its own width) is disclosed. The method is applicable for high energy implantation or other processes requiring thick photoresists with high aspect ratios, with one embodiment comprising the following:

(a) forming a thick film of positive photoresist on a silicon substrate
(b) prebaking (softbaking) the thick film using non-typical conditions
(c) exposing the thick film using UV light
(d) post exposure baking (PEB) the thick film using non-typical conditions
(e) developing the exposed, thick film
(f) stabilizing the thick film using non-typical conditions According to this method, a thick film of photoresist with high aspect ratios can be accurately and advantageously formed. A described embodiment uses a resist approximately 4 microns thick on an approximate 2 micron pitch, resulting in a pre-stabilization aspect ratio of around 4:1. Such a resist is suitable for implanting sub-micron devices with energies exceeding 1 MeV.

18 Claims, 4 Drawing Sheets

OTHER PUBLICATIONS

Loechel et al., "Application of Optical Lithography for High Aspect Ratio Microstructures", J. Vac. Sc. Technol. B, vol. 14, No. 6, pp. 4179–4183, Nov./Dec. 1996.

Shimizu et al., Deep Submicron Field Isolation with Buried Insulator between Polysilicon Electrodes (BIPS), IEICE Trans. Electron., vol. E77–C, No. 8, pp. 1369–1376, Aug. 1994.

Buffat Stephen J., "Development of a Thick Film Photolithographic Process for High Energy Implantation", Zilog, Inc. Lithography Equipment & Materials.

O'Connor et al., "End Station and Beam Line Design COnsiderations for Photoresist Outgassing with High Energy (MeV) Ion Implantation", Proceedings of the Eleventh International COnference on Ion Implantation Technology, Jun. 16–21, 1996, pp. 350–354.

Buffat et al., "Evaluation of Election Beam Stabilization for Ion Implant Processing", Resist Technol. Process, XVI, 3698, 1999.

Calvert et al., "Fabrication of Hollow High Aspect Ratio Metal Microstructure Arrays", Mat. Res. Symp. Proc. vol. 260, 1992, pp. 381–385.

Peckerar et al., "High Aspect Ratio Resist Structures for Optoelectronic (and other) Applications", SPIE, vol. 2045, 1993 pp. 298–305.

Loechel et al., "Influence of Resist Baking on the Pattern Quality of Thick Photoresists", SPIE, vol. 2879, 1996, pp. 174–180.

Brown et al., "Interaction Between Photoresist Pre–Treatment and High Aspect Ratio Contact and Via Hole Definition", SPIE, vol. 2090, 1993, pp. 40–52.

Borland et al., "MeV implantation technology: Next–generation manufacturing with Current–generation Equipment", Solid State Technology, vol. 36, No. 12, pp. 28–35, Dec. 1993.

Chen et al., "Process development for 180–nm, Structures using Interferometric Lithography and I–Line Photoresist", SPIE, vol. 3048, 1997, pp. 309–318.

Stolmeijer et al., "Profile Engineering for Sub–Micron CMOS using High Energy ION Implantation", 1989 International Symposium on VLSI Technology, Systems and Applications, pp. 317–320.

* cited by examiner

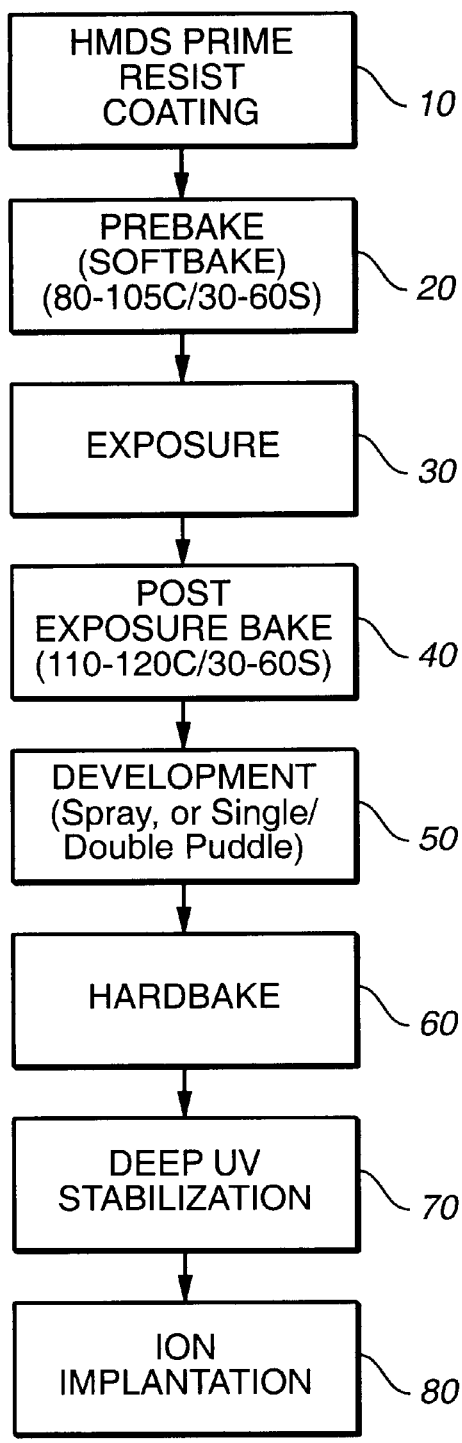
FIG._1
*(PRIOR ART)*
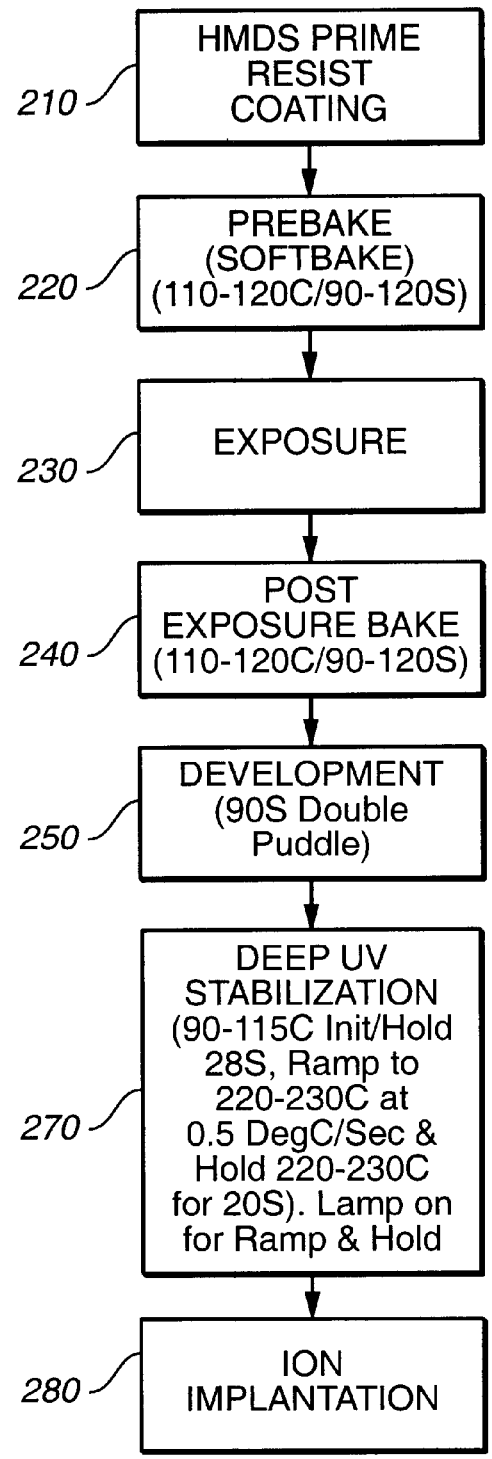
FIG._2

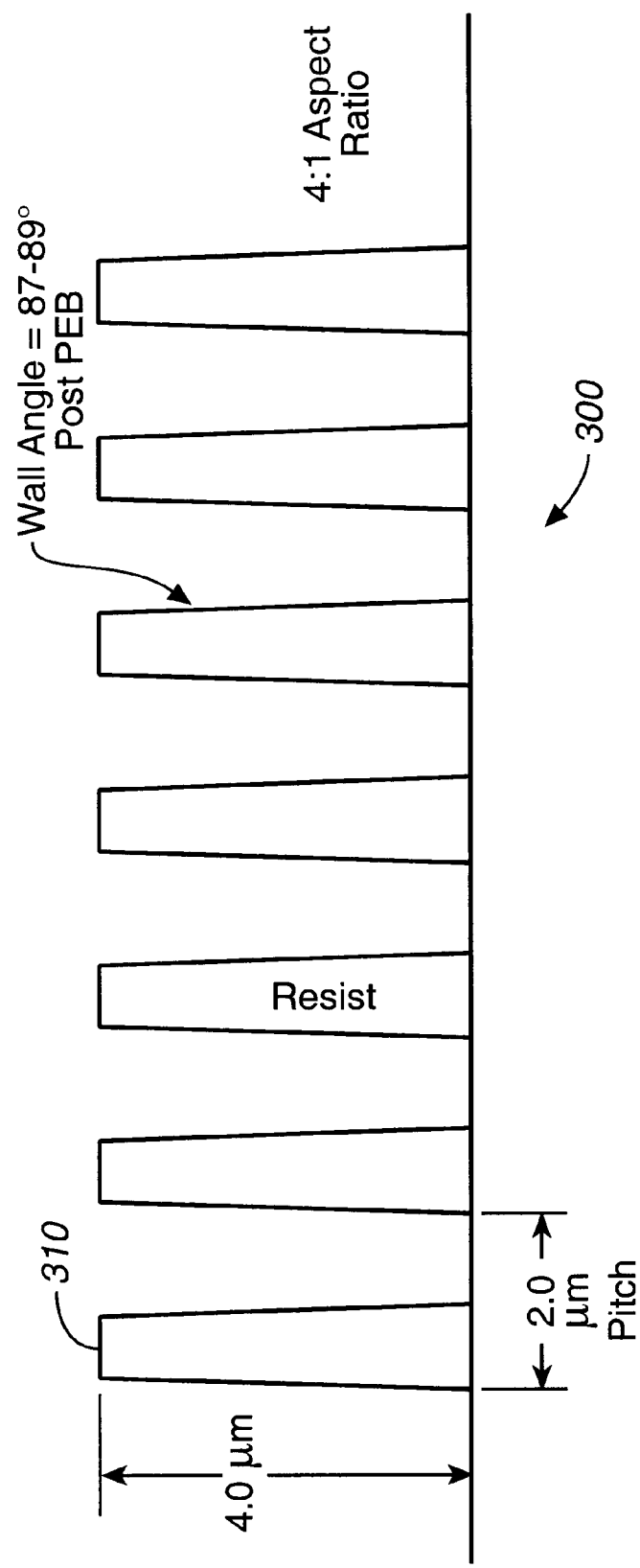
FIG._3

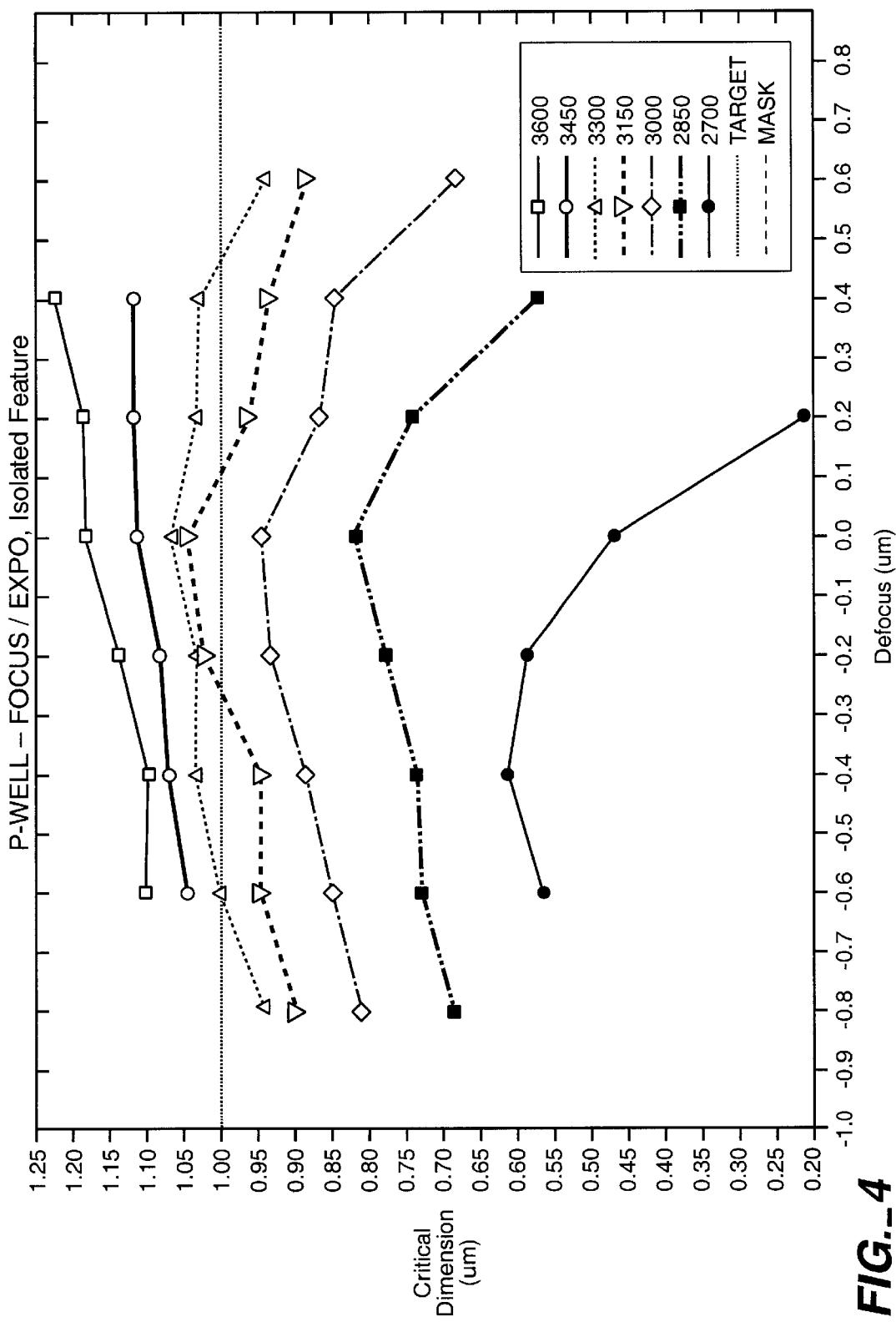
FIG._4

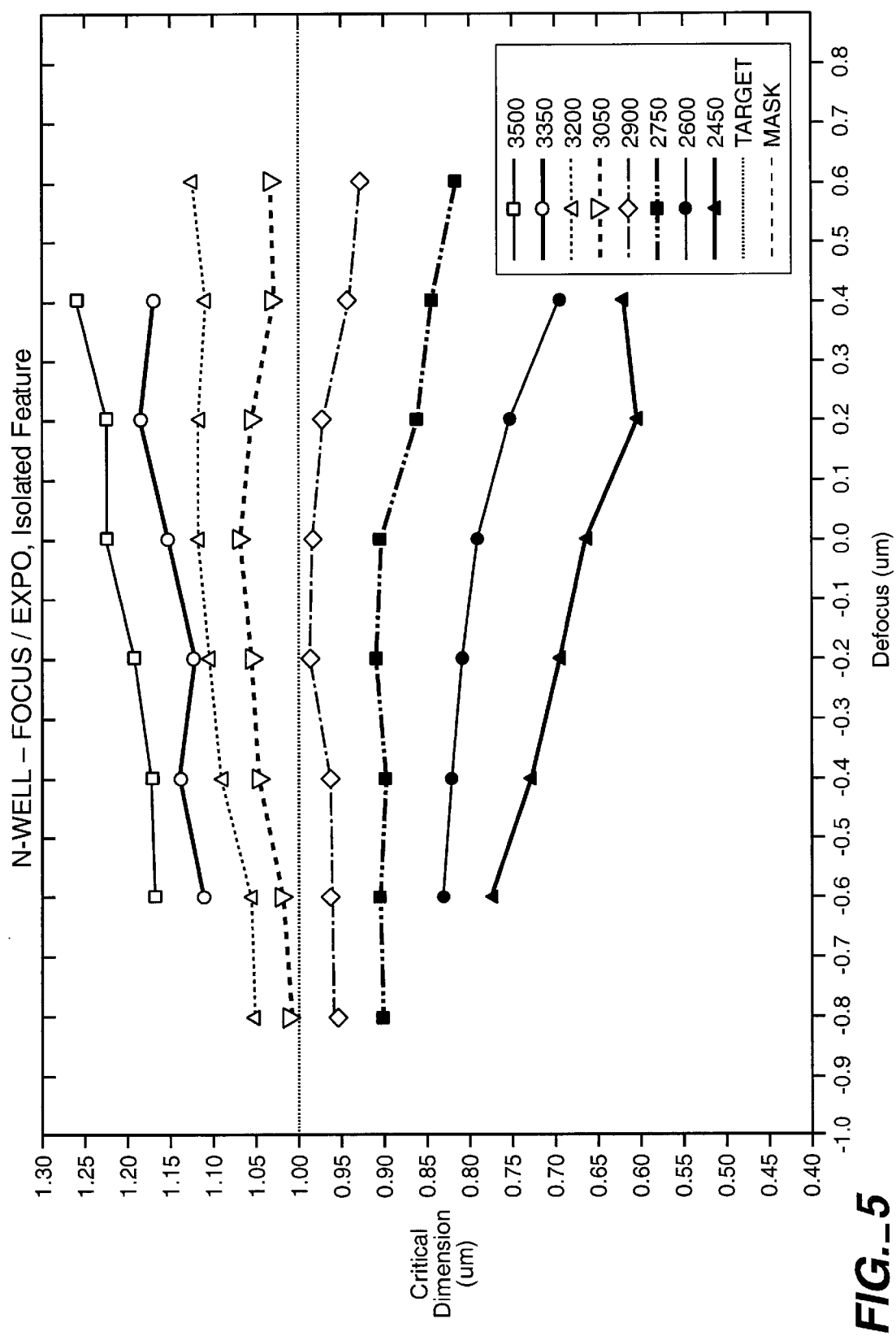
FIG._5

HIGH ASPECT RATIO PHOTOLITHOGRAPHIC METHOD FOR HIGH ENERGY IMPLANTATION

BACKGROUND OF THE INVENTION

This invention relates to the fabrication of semiconductor devices as it applies to thick films, and more specifically, to high aspect ratio photolithographic processes.

The use of high energy ion implantation has found a growing number of uses in the fabrication of semiconductor devices, such as retrograde well CMOS, advanced processes used in well engineering, or other high energy implant uses. As the energies used increase through several hundred KeV into the MeV range, ever thicker photoresists are needed to shield those areas to be protected from the implantation. At the same time, the feature size of such devices has become smaller. These competing aims of decreasing scale, down to 0.35 µm and smaller CMOS processes, and increasing energy, into the MeV range, requires narrower areas of thicker resists, leading to higher aspect ratios, defined here as the thickness of the photoresist to width of the mask line. Producing a photoresist process capable of meeting these conflicting demands is of great importance as process techniques advance.

FIG. 1 is a flowchart of a conventional single-layer photolithographic process used in a typical lower energy ion implantation. First, in step 10 a photosensitive layer of a novolak positive photoresist is formed on the upper most surface of a silicon substrate previously subjected to a hexamethyldisanzane (HMDS) treatment to improve adhesion. The film thickness is typically less than 2.0 microns. This film is then prebaked, or softbaked, in step 20, customarily at 80–105° C., with a value of 90° C. typically, for anywhere between 30 and 60 seconds. The purpose of the prebake is to drive off the casting solvent in the photoresist. A pattern in the resist film is formed in step 30 utilizing ultraviolet light that is selectively irradiated onto the resist layer using a reticle. In step 40 the film is post exposure baked (PEB) at the higher temperature of 110–120° C., with a value of 115° C. typical, for 30–60 seconds. This post expose bake significantly reduces the standing wave effect in the film from the exposure.

The exposed film is then developed in an aqueous developer, step 50. Spray, single or double puddle, or hybrid "spuddle" development processes lasting 60 to 90 seconds are common. In the case of a positive resist, the developer removes that portion that has been exposed by the ultraviolet light.

Typically, the now patterned resist film is ultraviolet stabilized after being baked again at 110–120° C. for 30–60 seconds to drive off remaining solvents and chemically crosslink the film in steps 60 and 70. Not all processes include the deep UV stabilization step and the hardbake of step 60 additionally helps to dry the wafer from step 50 when step 70 is absent. A standard stabilization in a deep UV tool will heat and expose the resist at the same time, typically heating from a temperature of 110° C. to 220° C. with the lamp on during portions of the process. During the stabilization process, the UV and thermal energies work together to remove residual solvents, moisture, and by-products (primarily nitrogen) from the photoactive compound decomposition and to chemically cross link the resist. Once the stabilization is complete, the resist is now ready for the ion implantation of step 80.

In this conventional process, a pattern is transferred from the reticle into the resist film. The pattern transfer process is limited. The linewidth of the formed pattern is required to have the same linewidth as the pattern on the reticle. For common thicknesses less than 1.5 µm, this is well know in the art. As the resist thickness increases and/or as the aspect ratios increase, the patterning process becomes extremely difficult. With the application of high energy ion implantation, such as for CMOS or other advanced well processing, thicker photoresist films with high aspect ratios are required, where a high aspect ratio is defined as greater than 2:1.

In one example of a high energy implantation, a retrograde twin well CMOS process forms two types of well structures in the same device. There are n-well and p-well regions in contact with the substrate. These twin well structures are formed by utilizing a high energy (MeV) ion implantation to place the dopant beneath a thin oxide layer and into the underlying silicon. A photoresist film consistent with high energy implantation is required to successfully block the implant species from being implanted in unwanted device regions. These resists may need to be 3–4 µm or thicker. Combined with the decreasing scale used of critical dimensions, some recent CMOS device design rules require ratios of 4:1 or greater. These challenges tax the capability of any photolithographic process.

A conventional single-layer photoresist process utilized in a high energy ion implantation application produces some very adverse effects. In thicker films, if residual casting solvents are allowed to remain in the resist film, a detrimental sidewall differential and other pattern deformations could occur which dramatically distort the printed image. These phenomena effect both isolated and dense features, but are particularly acute in isolated features. Maintaining acceptable critical dimension stability and uniformity, step coverage, and process latitudes all become increasingly difficult as the aspect ratio increases. Appropriate process conditions are needed to both minimize outgassing at implantation and produce a resist of uniformly hardened through its cross-section.

Proper choices for the parameters of the various bake stages are needed to minimize these problems. Due to the chemical properties of the both the resist and the solvent, the glass transition and decomposition temperatures of the resist along with the volatility and boiling point of the casting solvent must all be considered. Although using higher bake temperatures may cause the solvent to evaporate and defuse more readily, above a certain temperature the resist components will begin to deteriorate. Therefore a difficult balance must be maintained. For the thicker resist layer needed for higher energy implantation, these difficulties become much greater. If the solvent is too volatile, or a bake temperature to high, the solvent may be driven from the outer portions of the resist too rapidly, thereby forming a skin which will seal in the solvents inside the resist film. This last problem can lead to unacceptable resist loss as the ions can wear through the hard outer layer into a soft center that is quickly lost. Also, when bombarded with such high energy ions, an improperly formed resist of the required aspect ratio may collapse. Additionally, this produces a degradation of the other required properties of the resist mentioned above which the art has learned to overcome for thinner resists, such as stability and uniformity for critical dimensions, step coverage, and process latitudes.

There are many other uses for high aspect photoresist in addition to their use in high energy implantation. The following methods have been known as methods of forming thick film photoresists patterns with high aspect ratios:

(A) In U.S. Pat. No. 5,262,281 a method is disclosed in the patterning of thick resists utilized in device and mask manufacture that provides excellent resolution and sensitivity, but this is obtained using a specific composition. Specifically, the composition involves polymers having recurring pendant acid labile a-alkoxyalkyl carboxylic acid ester and/or hydroxyaromatic ether moieties in the presence of a substance that is an acid generator upon exposure to actinic radiation.

(B) In U.S. Pat. No. 5,330,881 discloses a resist patterning process which allows generation of very thick (>3.0 μm), vertically-walled resist patterns which allow for the subsequent deposition or etching operations. The application for this process is for magnetic thin film heads and other devices requiring high aspect ratios. The invention utilizes a barrier layer in conjunction with a contrast enhancement layer to provide the vertically-walled resist patterns.

(C) In U.S. Pat. No. 5,340,702, a method is disclosed for accurately forming a thick, fine pattern of photoresist. This is accomplished by (1) forming a film of a positive photoresist on a substrate, having a thickness of 50 to 500 microns, (2) forming a light-shielding film (consisting of lead, tin, indium, copper and alloys of these) directly on a surface of the film of photoresist, (3) processing the light-shielding film into the pattern, (4) exposing the film of the positive photo resist and (5) developing the exposed film of photoresist. The application for this process is in the production of a printed circuit substrate. The method is used to accurately pattern resists having a thickness of 50 to 500 microns.

(D) Work has been done on very thick photoresists for micro-device work, such as U.S. Pat. Nos. 5,356,828 and 5,722,162. Although much of this work involves thick or extremely thick photoresists, it is done at a much larger scale, well above the feature size needed here.

(E) Other work, such as for example Chen et al., "Process Development for 180-mm Structures Using Interferometric Lithography and I-Line Photoresist", describes photoresists with a high aspect ratio, but done with thinner resists. It does not describe photoresists of the thickness needed here and works at a more common resist thickness in the range of 1 μm. Even for such thinner photoresists, this paper describes many of the problems encountered for high aspect ratios.

None of this work describes a method to produce a photoresist suitable for high energy ion implantation with both energies increasing into the MeV range and scale decreasing down to a 0.35 μm CMOS process. This requires a highly stable photolithographic process which can produce a resist with aspect ratios of 4:1 or even higher.

Therefore, it is the primary object of the present invention to present a method of producing a photoresist for high energy ion implantation for mask level pitches of 2.0 μm or less and post softbake aspect ratios of over 3:1.

Consequently, it is another object to present a method of producing a photoresist thicknesses of more than 3 to 4 microns and widths which may be 1 micron or less, resulting in aspect ratios of 3:1 to 4:1 or greater. The photolithographic method should improve critical dimension stability and uniformity, step coverage, and process latitudes. The method should also be processed to minimize unexposed resist loss and isolated/dense linewidth biases, along with the properties of decreasing nitrogen outgassing and increasing contrast through develop.

It is a further object to use such photoresists to form a retrograde twin well, 0.35 μm CMOS semiconductor device.

SUMMARY OF THE PRESENT INVENTION

These and additional objects are accomplished by the various aspects of the present invention, wherein, briefly and generally, according to one such aspect, a highly stable photolithographic process is defined. In a preferred embodiment, the photoresist film is applied using a commercial coating system at some final speed to achieve the required film thickness of up to 4.2 μm using a commercial, high contrast, I-line novolak photoresist. The photoresist film is then prebaked (softbaked) at 115 to 120° C. for 90 to 240 seconds to remove the casting solvent from the film. To define the latent image, a commercial step and repeat I-line system is utilized. After exposure, the film is then post exposure baked at 115 to 120° C. for 90 to 240 seconds to remove additional casting solvent and wafer and to reduce the standing waves from exposure. The film is then developed using a 0.26N, metal-ion-free developer containing 2.3% TMAH by weight in water. In one variation, a commercial deep UV system is used to then stabilize the film by ramping from an initial idle temperature of 90 to 115° C. to a final temperature of 220 to 230° C. while incorporating the use of an UV lamp. Another variation utilizes a non-thermal electron beam stabilization. This process is highly stable and results in extremely non-typical post softbake aspect ratios of up to 4.2:1.

According to other aspects of the present invention, this process uses non-typical softbake conditions. It was determined that for softbake conditions at lower temperature and time, residual solvents are retained in the photoresist film producing a detrimental sidewall differential. This phenomenon was worse in isolated features, but effected both isolated and dense features. The higher softbake conditions remove the majority of the residual solvent and eliminate the sidewall differential.

A further aspect is that the photoresists allow the use of implantation of ions with energies into the MeV range for mask level pitches of 2.0 μm and smaller. This is done by use of a photoresist of sufficient thickness and sufficient narrowness produced by the described method.

An additional aspect is the use of such photoresists and high energy ion implantation for a retrograde twin well, 0.35 μm CMOS process. The p-well and n-well layers are implanted utilizing MeV boron and phosphorous respectively.

All these aspects have applications to the high aspect ratio, photolithographic method for high energy ion implantation according to the present invention. Additional objects, advantages, and features of the present invention will become apparent from the following description of its preferred embodiments, which description should be taken in conjunction with the accompanying drawings.

BRIEF DESCRIPTION OF THE DRAWINGS

FIG. 1 is a flow chart of a typical prior art process for forming a photoresist for high energy ion implantation.

FIG. 2 is a flow chart of the process for forming a photoresist for high energy ion implantation in an embodiment of the present invention.

FIG. 3 is illustrative of the dimensions involved for a described process.

FIG. 4 shows p-well critical dimension of an isolated space feature as a function of defocus at different exposure levels.

FIG. 5 shows n-well critical dimensions of an isolated space feature as a function of defocus at different exposure levels.

DESCRIPTION OF THE PREFERRED EMBODIMENT

The high aspect ratio, photolithographic method for high energy ion implantation according to the present invention will be explained in detail. This starts with the description of a preferred embodiment for forming a photoresist. A flow chart describing the process is given in FIG. 2.

First, in step 210 a semiconductor substrate of silicon is subjected to an HMDS (hexamethyldisanzane) treatment. This is a two step treatment, first exposing the surface of the wafer to 55 to 65 second hot plate at approximately 120° C. with 50 to 60 second HMDS vapor, with respective values of approximately 60 and 55 seconds preferred, and then a 55 to 65 second cold plate treatment at approximately 22° C. with 55 to 65 second HMDS vapor, with respective values of approximately 60 and 55 seconds again preferred. This forms a monolayer upon the substrate tying up any moisture to promote better adhesion of the resist layer.

A commercial high contrast, I-line novolak positive photoresist is then applied to the semiconductor substrate using a commercial spin-coating system. The photoresist is coated dynamically at a constant slow speed spin, accelerates to a final dry, followed by a final spin speed adjusted to achieve the required film thickness between 2.7 and 4.2 microns, depending on the application. Although most novolak photoresists with the proper viscosity should be usable, the preferred embodiment uses Shipley SPR3625 or other photoresist that contains groups which generate carboxylic acid upon said subsequent exposure to irradiation.

Next, the photoresist film is prebaked on a hot plate in step 220 to drive off the casting solvent, thereby densifying and stabilizing the film. The photoresist film is prebaked at 110 to 120° C. for 60 to 240 seconds, with the preferred values being approximately 115° C. at 90, or 90 to 120, seconds. The prebake is performed in a proximity mode with a 0.02 mm separation between the substrate and the hot plate. These are extremely non-typical values, being substantially hotter and longer than in the prior art of step 20 in FIG. 1 in order to drive off more solvent before exposure.

Step 230 then exposes the coated substrate with a commercial step and repeat I-line system as in the prior art of step 30. In the preferred embodiment using a pattern with a mask level pitch of no more than 2 microns, the numerical aperture and partial coherence of the exposure system are set to 0.45 and 0.70, respectively, and the illumination is monochromatic at approximately 365 nm. In a preferred embodiment described below which employs a common resist thickness of approximately 4 $\mu$m for both the p-well and n-well masks, exposures of approximately 3150 J/m$^2$ and 2960 J/m$^2$ for p-well and n-well masks, respectively, are used, both with a nominal focus of 0.0 $\mu$m.

Then, the exposed photoresist is post exposure baked (PEB), step 240, on a hot plate to further drive off the residual casting solvents and to minimize standing waves from exposure. The photoresist film is PEB at 110 to 120° C. for 90 to 120 seconds, the preferred values again being approximately 115° C. at 90 seconds. Post exposure baking is performed in proximity mode with a 0.02 mm separation between the substrate and the hot plate. This is again longer than common in the prior art as shown in step 40 of FIG. 1.

The photoresist film is then subjected to a soft impact, double puddle development with a commercial alkaline metal-ion-free developer in step 250. The time will vary inversely with the normality and concentration of the developer used, taking about 60 to 120 seconds for a developer with a 0.2–0.3 normality and concentration 2–3% tetramethylammonium hydroxide (TMAH) by weight in water: The preferred embodiment uses JSR PD523AD, a 0.26 normality developer containing 2.38% TMAH by weight in water that requires a corresponding development time of approximately 90, or 80 to 100, seconds. This developer further contains a non-ionic surfactant.

Lastly, in step 270 subjects the patterned photoresist is stabilized. In the embodiment of FIG. 2, this is a deep UV stabilization treatment utilizing a commercial deep UV system, although other stabilization procedures, such as electron beam, could be used. This treatment stabilizes the resist pattern to minimize the resist flow during subsequent high temperature or high energy processing stages, such as the subsequent ion implantation described below. A number of deep UV stabilization methods are available to heat and expose the resist. In a preferred embodiment, the patterned photoresist film prebakes at approximate values of 90–115° C. for a nominal time of 28 seconds (27 to 29 seconds) while the lamp flashes two to three times. Initial idle temperature then ramps to a final temperature of 220° to 230° and post bakes there for a nominal time of 20 seconds (19 to 21 seconds), all under a high intensity bulb. The ramping is done at an average rate of 0.5° C./second, resulting in a total of at least 250 to 300 seconds under the high intensity bulb. This ramp rate is equipment limited and it is believed that even slower rates would give better results.

Note that there is no hardbake step corresponding step 60 of the generic process described above in FIG. 1. With the process of FIG. 2 described above, the inclusion of a 130° C., 60 second post development bake, which would correspond to missing step 260, is found to be detrimental to the dark and light field features of the high aspect ratio resists so formed. Substantial erosion to wall profiles occurs, particularly in the isolated features, as the effects of such higher temperature bakes are more pronounced on these thicker films.

FIG. 3 is a drawing illustrative of the dimensions involved in an embodiment of a photoresist formed by this method. The photoresist 310 is composed as a row of ridges upon the semiconductor body 300. The ridges are shown with a height of 4.0 $\mu$m with a pitch of 2.0 $\mu$m, resulting in an aspect ratio of 4:1. In practice, the preferred embodiment is a height of greater than 3 $\mu$m in the range of 3.85 $\mu$m to 4.15 $\mu$m, and the ridges and spaces both of a width in the range of 0.9 $\mu$m to 1.1 $\mu$m. The wall angle is 86–89° after develop. The process is quite stable in the production of sidewall angles above 86° prior to stabilization, with the preferred embodiment yielding modeled values of 86.43° and 86.29° for isolated and dense features, respectively. The relevance of these dimensions is discussed below in reference to the use of the photoresist in step 280 of FIG. 2, the ion implantation. The process of deep UV stabilization tends to reduce the sidewall angles on large bulk isolated features, particularly at the higher values of the initial idle temperature range. By using the lower idle temperature values, post-stabilization sidewall angles of 82–84° are possible for isolated features.

An alternative embodiment employs electron bean stabilization. In this embodiment, an electron beam system utilizes a flood electron source in a non-thermal process flow. This method produces less sidewall angle degradation as the stabilization is non-thermal. This is an advantage as electrons can initiate reactions that may take 200 to 250° C. to activate. Additionally, the range of the electrons in material is set by the accelerating potential, whereas the range of UV light is wavelength limited, an effect known as skin depth, and material limited. This range can be varied form about 1000 Å at 1 keV to almost 4.5 $\mu$m at 15 keV. Using electron beam stabilization, wall angle is found to degrade no more than around 3°, while in some deep UV stabilizations, the deterioration of wall angle on some test structures may exceed 10°.

For comparison with the high aspect ratio, photolithographic method according to the above-described example, the same photoresist was processed utilizing a typical photo process as described above with respect to FIG. 1. The prebake, post exposure bake, and deep UV stabilization conditions, steps 20, 40, and 70, are typically 80–105° C. for 30–60 seconds, 110–120° C. for 30–60 seconds, and 110° C. ramped to 190° C. respectively. Using this process for films 2–3 µm and above results in retention of residual solvents in the photoresist film producing a detrimental sidewall differential and image deformation. This phenomenon is worse in isolated features but effects both isolated and dense features. The high aspect ratio, photolithographic method described above removes the majority of the residual solvent and greatly ameliorates this phenomenon.

Besides correcting the sidewall differential and deformation phenomenon, the described embodiment of a photolithographic method with a higher softbake temperature drastically improves critical dimension stability and uniformity, step coverage, and process latitudes. Exposure and focus latitudes are shown in FIGS. 4 and 5 for p-well and n-well mask layers, respectively. These figures shows critical dimension of an isolated space feature as a function of defocus at different exposure levels. In both figures, the target critical dimension was 1 µm and target resist thickness of 4 µm, as described below in preferred the high energy implant embodiment. Exposures of approximately 3150 J/m$^2$ and 2960 J/m$^2$ for the p-well and n-well mask layers, respectively, are used, both with a nominal focus of 0.0 µm. The results are quite stable about the preferred range of values, as are the similar results for dense features. These attributes all contribute to a higher quality resist at a thickness considered to present intractable problems. Similarly, by increasing contrast through develop, better resolution of features is obtained. The process also minimizes unexposed resist loss and linewidth biases between isolated features and dense features. Furthermore, decreasing the amount of residual solvents reduces nitrogen outgassing at implantation and thereby maintains a better vacuum.

The preferred use of such a photoresist is for high energy ion implantation, a process of increasing importance in semiconductor fabrication. As the energies used have increased, so has the corresponding requirement for thicker resists. At the same time, the drive for smaller feature size requires a trade off between such thicker resists for better protection and thinner resists for better control and feature definition. The high aspect ratios of the invention help to reconcile these conflicting aims. This discussion of the process is with respect to a retrograde twin well CMOS device, but is applicable in many other uses of high energy implantation.

In the preferred embodiment, the use of high energy boron and phosphorous ions constrains the masking layers to exceed a minimum thickness as the resist formed in steps 210–240 as described above must be thick enough to withstand not only resist loss during the implantation of step 280, but also a loss of thickness due to the develop of step 250, the bakes of steps 220 and 240, and shrinkage during stabilization step 270. These energies employed range from several hundred KeV into the MeV range. For the preferred implant species, these values exceed 600 KeV for B+ implantation and 1 MeV for P+ use, both with dose levels of approximately 1×10$^{13}$ cm$^{-2}$. At these preferred energy values, minimum thicknesses of 3.4 µm, corresponding to an aspect ratio of 3.4:1, after stabilization are needed for the implantations, with the preferred thickness for the resist between 3.8 µm and 4.2 µm to allow for resist loss.

This preferred embodiment is for a twin well retrograde, submicron CMOS device, where the ability to produce vertical sidewalls for the resist is important for determining how close the device can be spaced: The steeper the sidewall angle, the closer the active n-well can be placed to the p-well. Maintaining a high resist wall angle throughout an implant masking process is important in controlling and minimizing cross-well device effects. The described process allows for pre-stabilization wall angles in excess of 86° for the 2 µm pitch required for 1 micron equal lines and spaces.

In two implant layers of the preferred embodiment of a twin well retrograde, 0.35 µm CMOS device, the p-wells are implanted with singly ionized boron at an energy of 600 to 800 KeV, with a nominal value of 700 KeV preferred, and the n-wells are implanted with singly ionized phosphorous at 1.3 to 1.5 MeV, with a nominal value 1.4 MeV preferred, both at a nominal dose of 1.0×10$^{13}$ cm$^{-2}$. The photoresist is formed according to the described method with the preferred values of in the range of 3.85 µm to 4.15 µm for the resist thickness, with a target of approximately 4 µm. In one embodiment, differing thicknesses for the p-well and n-well layers could be employed to account for the differing energies and properties of the implant species, but as this leads to additional processing variations, a single resist thickness of approximately 4 µm for both is preferred. It is for this preferred thickness that the exposures of approximately 3150 J/m$^2$ and 2960 J/m$^2$ for the p-well and n-well mask layers, respectively, and nominal 0.0 µm focus described above with respect to FIGS. 4 and 5 are used. As this is done on a 2 micron pitch, the resultant aspect ratios are between 3.8:1 and 4.2:1.

Various details of the implementation and method are merely illustrative of the invention. It will be understood that various changes in such details may be within the scope of the invention, which is to be limited only by the appended claims.

What is claimed is:

1. A photolithographic method for patterning a highly stable process comprising:
   forming a photoresist on a semiconductor body, wherein said photoresist has a thickness of greater than 3 µm;
   prebaking said photoresist;
   subsequently exposing body to irradiation with a pattern having a pitch of not more than 2 µm;
   post-exposure baking the exposed photoresist;
   subsequently developing the post-exposure baked photoresist prior to stabilizing said photoresist, wherein the wall angle of said photoresist is within the range of from 86° to 89° after said developing; and
   stabilizing the developed photoresist.

2. The method according to claim 1, wherein said photoresist contains groups which generate carboxylic acid upon said subsequent exposure to irradiation, wherein said exposing of the prebaked photoresist on a semiconductor body to irradiation is under conditions sufficient to form carboxylic acid groups in said photoresist.

3. The method according to claim 2, wherein said prebaking is performed at a temperature within the range of from 110° C. to 120° C. and for a time within the range of from 90 seconds to 120 seconds.

4. The method according to claim 3, wherein said post-exposure baking is performed at a temperature within the range of from 110° C. to 120° C. and for a time within the range of from 90 seconds to 120 seconds.

5. The method according to claim 4, wherein said developing is for a time within the range of from 80 seconds to 100 seconds performed in a double puddle process.

6. The method according to claim 5, wherein said stabilizing the developed photoresist is deep UV stabilization.

7. A photolithographic method for patterning a highly stable process comprising:

forming a photoresist on a semiconductor body, wherein said photoresist has a thickness of greater than 3 μm, wherein said photoresist contain groups which generate carboxylic acid upon exposure to irradiation;

prebaking said photoresist, wherein said prebaking is performed at a temperature with the range of from 110° C. to 120° C. and for a time within the range of from 90 seconds to 120 seconds;

subsequently exposing body to irradiation with a pattern having a pitch of not more than 2 μm, wherein said exposing of the prebaked photoresist on a semiconductor body to irradiation is under conditions sufficient to form carboxylic acid groups in said photoresist;

post-exposure baking the exposed photoresist, wherein said post-exposure baking is performed at a temperature within the range of from 110° C. to 120° C. and for a time within the range of from 90 seconds to 120 seconds;

subsequently developing the post-exposure baked photoresist prior to stabilizing said photoresist, wherein said developing is for a time within the range of from 80 seconds to 100 seconds performed in a double puddle process; and stabilizing the developed photoresist, wherein said stabilizing the developed photoresist is deep UV stabilization, wherein said deep UV stabilization comprises baking at an initial temperature within the range of from 90° C. to 115° C. and for a time within the range of from 27 seconds to 29 seconds, subsequently ramping from the initial temperature to a final temperature within the range of from 220° C. to 230° C. at an average rate of not more than 0.5° C./second and then post-ramp baking at said final temperature for a time within the range of from 19 seconds to 21 seconds, wherein the resist is exposed to deep UV radiation for the ramp and post-ramp bake.

8. The method of claim 7, wherein the aspect ratio of the thickness of said photoresist to the width of said photo resist exceeds 3.4:1 subsequent to stabilizing the developed photoresist.

9. A photolithographic method for patterning a highly stable process comprising:

forming a photoresist on a semiconductor body, said photoresist containing groups which generate carboxylic acid upon irradiation;

prebaking said photoresist at a temperature within the range of from 110° C. to 120° C. and for a time within the range of from 90 seconds to 120 seconds;

subsequently exposing body to irradiation under conditions sufficient to form carboxylic acid groups in said photoresist;

post-exposure baking the exposed photoresist at a temperature within the range of from 110° C. to 120° C. and for a time within the range of from 90 seconds to 120 seconds;

subsequently developing the post-exposure baked photoresist prior to stabilizing said photoresist, wherein the wall angle of said photoresist is within the range of from 86° to 89° after said developing; and stabilizing the developed photoresist, wherein the aspect ratio of the thickness of said photoresist to the width of said photoresist exceeds 3.4:1 subsequent to stabilizing the developed photoresist and wherein said exposing body to irradiation is performed with a pattern having a pitch of not more than 2 μm.

10. A photolithographic method for patterning a highly stable process comprising:

forming a photoresist on a semiconductor body, said photoresist containing groups which generate carboxylic acid upon irradiation;

prebaking said photoresist at a temperature within the range of from 110° C. to 120° C. and for a time within the range of from 90 seconds to 120 seconds;

subsequently exposing body to irradiation under conditions sufficient to form carboxylic acid groups in said photoresist;

post-exposure baking the exposed photoresist at a temperature within the range of from 110° C. to 120° C. and for a time within the range of from 90 seconds to 120 seconds;

subsequently developing the post-exposure baked photoresist prior to stabilizing said photoresist, wherein the wall angle of said photoresist is within the range of from 86° to 89° after said developing; and stabilizing the developed photoresist, wherein the thickness of said photoresist is greater than 3.4 μm subsequent to stabilizing the developed photoresist.

11. A photolithographic method for patterning a highly stable comprising:

forming a photoresist of a first thickness on a semiconductor body, said photoresist containing groups which generate carboxylic acid upon irradiation;

prebaking said photoresist at a temperature within the range of from 110° C. to 120° C. and for a time within the range of from 90 seconds to 120 seconds;

subsequently exposing body to irradiation with a pattern having a pitch of not more than 2 μm under conditions sufficient to form carboxylic acid groups in said photoresist;

post-exposure baking the exposed photoresist at a temperature within the range of from 110° C. to 120° C. and for a time within the range of from 90 seconds to 120 seconds;

subsequently developing the post-exposure baked photoresist prior to stabilizing said photoresist, wherein the wall angle of said photoresist is within the range of from 86° to 89° after said developing; and stabilizing the developed photoresist, wherein said first thickness is such that the aspect ratio of the thickness of said photoresist to the width of said photoresist exceeds 3.4:1 subsequent to stabilizing the developed photoresist.

12. A photolithographic method for patterning a highly stable process comprising:

forming a photoresist on a semiconductor body, wherein said photoresist has a thickness of greater than 3 μm;

prebaking said photoresist;

subsequently exposing body to irradiation with a pattern having a pitch of not more than 2 μm;

post-exposure baking the exposed photoresist;

subsequently developing the post-exposure baked photoresist prior to stabilizing said photoresist; and stabilizing the developed photoresist, wherein said stabilizing the developed photoresist is deep UV stabilization, wherein said deep UV stabilization comprises baking at an initial temperature within the range of from 90° C. to 115° C. and for a time within the range of from 27 seconds to 29 seconds, subsequently ramping from the initial temperature to a final temperature within the range of from 220° C. to 230° C. at an average rate of not more than 0.5° C./second and then post-ramp baking at said final temperature for a time within the range of from 19 seconds to 21 seconds, wherein the resist is exposed to deep UV radiation for the ramp and post-ramp bake.

13. The method according to claim 12, wherein said photoresist contains groups which generate carboxylic acid upon said subsequent exposure to irradiation, wherein said exposing of the prebaked photoresist on a semiconductor body to irradiation is under conditions sufficient to form carboxylic acid groups in said photoresist.

14. The method according to claim 12, wherein said prebaking is performed at a temperature within the range of from 110° C. to 120° C. and for a time within the range of from 90 seconds to 120 seconds.

15. The method according to claim 12, wherein said post-exposure baking is performed at a temperature within the range of from 110° C. to 120° C. and for a time within the range of from 90 seconds to 120 seconds.

16. The method according to claim 12, wherein said developing is for a time within the range of from 80 seconds to 100 seconds performed in a double puddle process.

17. The method of claim 12, wherein the aspect ratio of the thickness of said photoresist to the width of said photo resist exceeds 3.4:1 subsequent to stabilizing the developed photoresist.

18. The method of claim 12, wherein the wall angle of said photoresist is within the range of from 86° to 89° after said developing.

* * * * *